(12) United States Patent
Aika

(10) Patent No.: US 10,043,702 B2
(45) Date of Patent: Aug. 7, 2018

(54) MANUFACTURING METHOD FOR SEMICONDUCTOR DEVICE AND SEMICONDUCTOR DEVICE

(71) Applicant: Renesas Electronics Corporation, Koutou-ku, Tokyo (JP)

(72) Inventor: Tomohiko Aika, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/640,564

(22) Filed: Jul. 2, 2017

(65) Prior Publication Data

US 2018/0082887 A1 Mar. 22, 2018

(30) Foreign Application Priority Data

Sep. 21, 2016 (JP) .................. 2016-183950

(51) Int. Cl.

| | |
|---|---|
| *H01L 21/00* | (2006.01) |
| *H01L 21/762* | (2006.01) |
| *H01L 21/308* | (2006.01) |
| *H01L 21/027* | (2006.01) |
| *H01L 21/311* | (2006.01) |
| *H01L 21/306* | (2006.01) |
| *H01L 29/66* | (2006.01) |
| *H01L 29/06* | (2006.01) |
| *H01L 29/78* | (2006.01) |
| *G03F 7/16* | (2006.01) |

(Continued)

(52) U.S. Cl.
CPC ........ *H01L 21/76224* (2013.01); *G03F 7/094* (2013.01); *G03F 7/11* (2013.01); *G03F 7/162* (2013.01); *G03F 7/24* (2013.01); *H01L 21/0273* (2013.01); *H01L 21/3081* (2013.01); *H01L 21/3085* (2013.01); *H01L 21/3086* (2013.01); *H01L 21/30604* (2013.01); *H01L 21/31111* (2013.01); *H01L 29/0649* (2013.01); *H01L 29/66681* (2013.01); *H01L 29/7816* (2013.01)

(58) Field of Classification Search
CPC .................................................. H01L 21/76224
See application file for complete search history.

(56) References Cited

U.S. PATENT DOCUMENTS

| | | | |
|---|---|---|---|
| 7,217,662 B2 | 5/2007 | Toyota et al. | |
| 8,703,577 B1 * | 4/2014 | Zhu | ..................... H01L 21/3081 |
| | | | 257/501 |

FOREIGN PATENT DOCUMENTS

| | | |
|---|---|---|
| JP | 2005-277050 A | 10/2005 |
| JP | 2011-061066 A | 3/2011 |

* cited by examiner

*Primary Examiner* — William Harriston
(74) *Attorney, Agent, or Firm* — Shapiro, Gabor and Rosenberger, PLLC

(57) ABSTRACT

A photoresist pattern is not formed in an outer circumferential region from an outer circumferential end of a semiconductor substrate up to 0.5 mm to 3.0 mm, in a process for patterning a silicon oxide film which will serve as a hard mask. A part of the silicon oxide film which is positioned in the outer circumferential region is removed, thereby exposing the semiconductor substrate, in a process for performing an etching process for patterning the silicon oxide film. In the process for performing the etching process for the semiconductor substrate with using the silicon oxide film as an etching mask, the surface of the semiconductor substrate of the outer circumferential region is lowered. Then, a step difference is formed in a position nearer to a chip formation region, in the semiconductor substrate.

17 Claims, 11 Drawing Sheets

(51) Int. Cl.
*G03F 7/24* (2006.01)
*G03F 7/09* (2006.01)
*G03F 7/11* (2006.01)

MANUFACTURING METHOD FOR SEMICONDUCTOR DEVICE AND SEMICONDUCTOR DEVICE

CROSS-REFERENCE TO RELATED APPLICATIONS

The disclosure of Japanese Patent Application No. 2016-183950 filed on Sep. 21, 2016 including the specification, drawings and abstract is incorporated herein by reference in its entirety.

The present invention relates to a manufacturing method for a semiconductor device and a semiconductor device, and is preferably applicable, for example, to a semiconductor device having a power system semiconductor element mounted therein.

BACKGROUND

There is a semiconductor device having a relatively deep isolation structure formed therein, to electrically insulate a plurality of semiconductor elements, as a semiconductor device in which a plurality of semiconductor elements, such as high withstand voltage power MOS (Metal Oxide Semiconductor) transistors, are mounted therein. This deep isolation structure is called a DTI (Deep Trench Isolation) structure.

In the DTI structure, an etching process is performed for the semiconductor substrate, with using a hard mask, such as a silicon oxide film, as an etching mask. By so doing, a relatively deep trench with a depth of approximately 1 µm to 10 µm is formed. Next, an insulating film is formed in this trench.

At this time, a thickness of the hard mask formed in the outer circumferential part of the semiconductor substrate is thinner than a thickness of the hard mask formed in the region inside the semiconductor substrate. Then, while performing the etching process, in the outer circumferential part of the semiconductor substrate, the part of the hard mask is removed. This may cause generation of a region in which the semiconductor substrate is exposed.

The exposed region of the semiconductor substrate is continuously etched, until the trench is formed. Thus, in the outer circumferential part of the semiconductor substrate, a level difference is generated between the region in which the semiconductor substrate is etched and the region in which the semiconductor substrate is not etched. The semiconductor substrate having the trench formed therein is transported for the next process. Then, a predetermined process is performed for the semiconductor substrate by a predetermined semiconductor manufacturing device.

When a process is performed for the semiconductor substrate in the semiconductor manufacturing device, the semiconductor substrate is held by a predetermined holding member. When the semiconductor substrate is transported, the semiconductor substrate is also held by a predetermined holding member. This holding member includes a holding member in a mode of simply pinching the outer circumferential part of the semiconductor substrate. It also includes a holding member in a mode of rotating in a state where the outer circumferential part of the semiconductor substrate is pinched.

Particularly, in a process after the DTI structure is formed, in a mode where a level difference is generated in the outer circumferential part of the semiconductor substrate, the outer circumferential part is pinched by the holding member. At this time, the holding member interferes with the level difference generated in the outer circumferential part of the semiconductor substrate. This may result in chipping a part of the semiconductor substrate. In addition, the semiconductor substrate may be broken.

To solve these problems, various proposals have been made. For example, Japanese Unexamined Patent Application Publication No. 2005-277050 proposes a technique for reducing a level difference by performing a polishing process for the level difference generated in the outer circumferential part of the semiconductor substrate. Japanese Unexamined Patent Application Publication No. 2011-61066 proposes a technique for avoiding etching of the outer circumferential part, by additionally forming a protective film covering the outer circumferential part of the semiconductor substrate and performing an etching process at the time of forming a trench. Japanese Unexamined Patent Application Publication No. 2011-61066 proposes also a technique for attaching a clamp to the outer circumferential part, to avoid etching of the outer circumferential part due to the etching process at the time of forming the trench.

SUMMARY

When the DTI structure is formed, it is demanded to reduce the chipping of the semiconductor substrate due to the level difference generated in the outer circumferential part of the semiconductor substrate.

Other objects and new features will be apparent from the descriptions of the present specification and the accompanying drawings.

A manufacturing method for a semiconductor device, according to an embodiment, includes the following steps. An element formation region is defined on a surface of a semiconductor substrate. A semiconductor element is formed in the element formation region. A first insulating film is formed to cover the semiconductor element. A mask having an opening part corresponding to a pattern of an element isolation part for electrically isolating the semiconductor element, by performing a first etching process for the first insulating film. An isolation trench reaching from the surface of the semiconductor substrate up to a first depth is formed, by performing a second etching process with using the mask as a first etching mask. The element isolation part is formed by forming a second insulating film in the isolation trench. The mask is formed in a state excluding an outer circumferential region from an outer circumferential end of the semiconductor substrate toward inward of the semiconductor substrate up to a first distance, in an outer circumferential part of the semiconductor substrate, in the step of forming the mask. The second etching process is performed for a part of the semiconductor substrate which is positioned in the outer circumferential region, in the step of forming the isolation trench.

A semiconductor device according to another embodiment includes an element formation region, a semiconductor element, an element isolation part, and an interlayer insulating film. The element formation region is defined on a semiconductor substrate. The semiconductor element is formed in the element formation region. The element isolation part is formed from a surface of the semiconductor substrate up to a first depth and electrically isolates the semiconductor element. The interlayer insulating film is formed to cover the semiconductor element. A surface of a part of the semiconductor substrate, which is positioned in an outer circumferential region from an outer circumferential end of the semiconductor substrate toward inward of the semiconductor substrate up to a first distance, is in a position lower than a surface of a part of the semiconductor substrate which is positioned in the element formation region, in an outer circumferential part of the semiconductor substrate.

According to a manufacturing method for a semiconductor device according to the embodiment, it is possible to reduce chipping of the semiconductor substrate.

According to a semiconductor device according to another embodiment, it is possible to reduce chipping of the semiconductor substrate.

DETAILED DESCRIPTION

Descriptions will now be made to a manufacturing method for a semiconductor device including a high withstand voltage power MOS semiconductor element and a DTI structure, according to embodiments.

Figure 1:
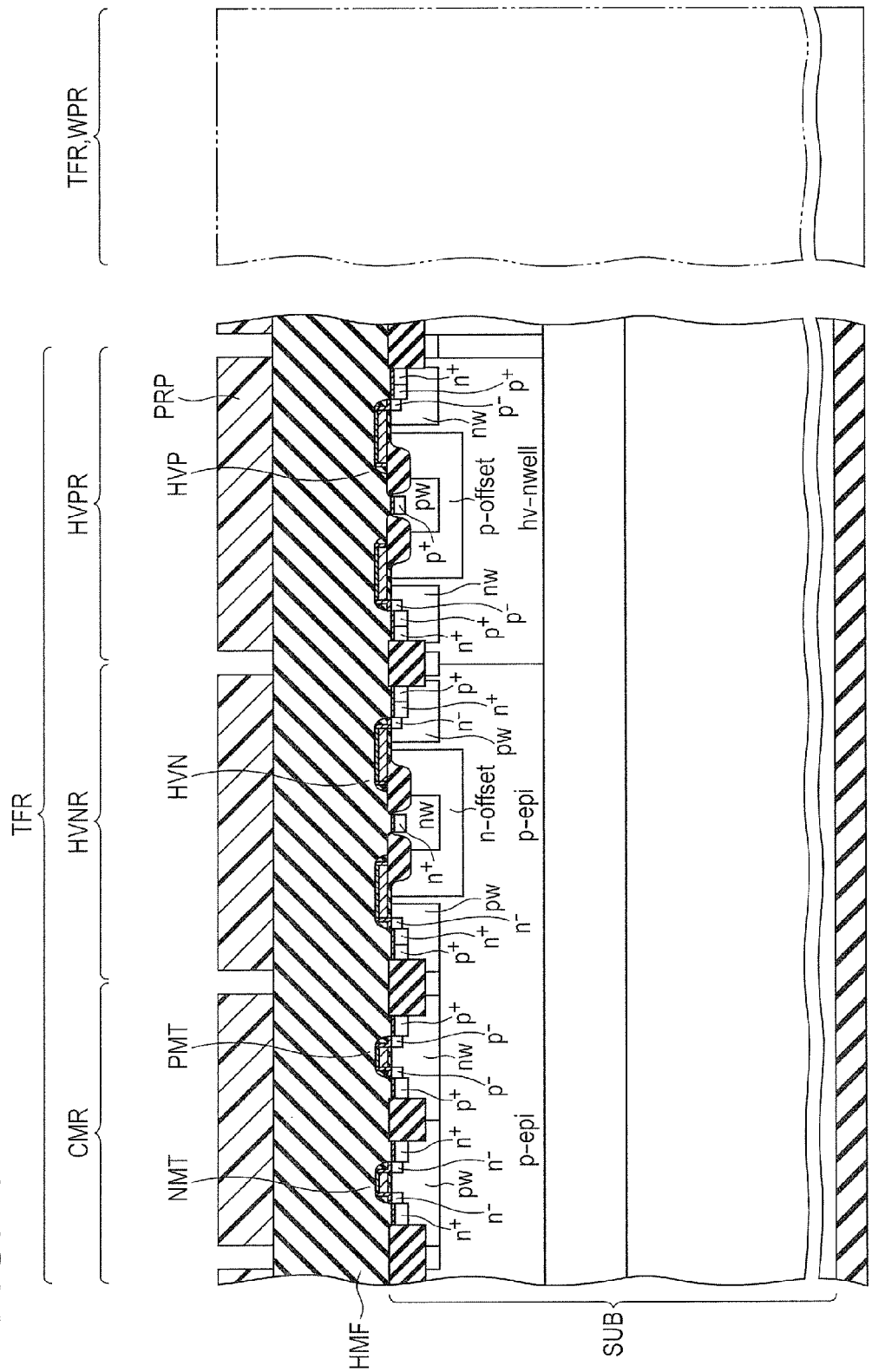
FIG. 1 is a cross sectional view showing a process of a manufacturing method for a semiconductor device, according to an embodiment.

As illustrated in FIG. 1, a chip formation region TFR is defined on a semiconductor substrate SUB. This region TFR includes a high withstand voltage NMOS transistor formation region HVNR, a high withstand voltage PMOS transistor formation region HVPR, and a CMOS (Complementary Metal Oxide Semiconductor) transistor formation region CMR.

A high withstand voltage NMOS transistor HVN is formed in the high withstand voltage NMOS transistor formation region HVNR. A high withstand voltage PMOS transistor HVP is formed in the high withstand voltage PMOS transistor formation region HVPR. An NMOS transistor NMT and a PMOS transistor PMT are formed in the CMOS transistor formation region CMR.

For example, a silicon oxide film HMF is formed to cover the high withstand voltage NMOS transistor HVN, the high withstand voltage PMOS transistor HVP, the NMOS transistor NMT, and the PMOS transistor PMT. This silicon oxide film HMF will serve as a hard mask. Next, a photoresist is applied to the silicon oxide film HMF, and a predetermined photoengraving process is performed, thereby forming a photoresist pattern PRP for forming a trench.

Figure 2:
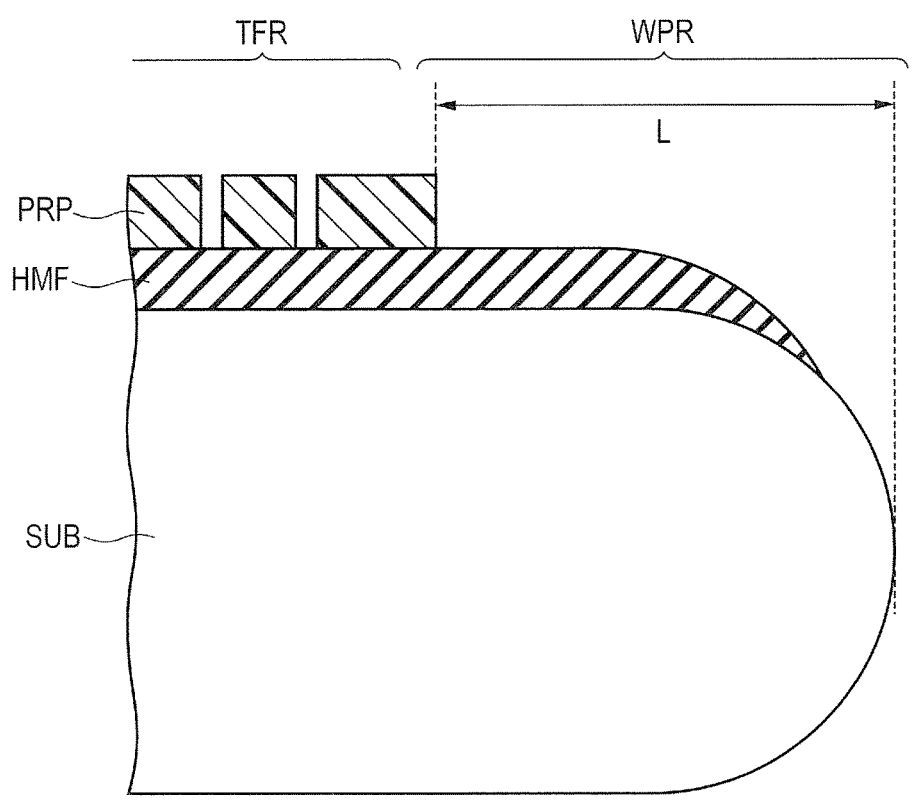
FIG. 2 is a partially enlarged cross sectional view showing a part including an outer circumferential part of a semiconductor substrate in a two-dot chain line illustrated in FIG. 1, in a process illustrated in FIG. 1, in the same embodiment.

At this time, as illustrated in FIG. 2, peripheral exposure is performed for the photoresist positioned in a region from the outer circumferential end of the semiconductor substrate SUB to a distance L (0.5 mm to 3.0 mm), in an outer circumferential part WRP of the semiconductor substrate SUB. At this time, a photoresist pattern is not formed.

Figure 3:
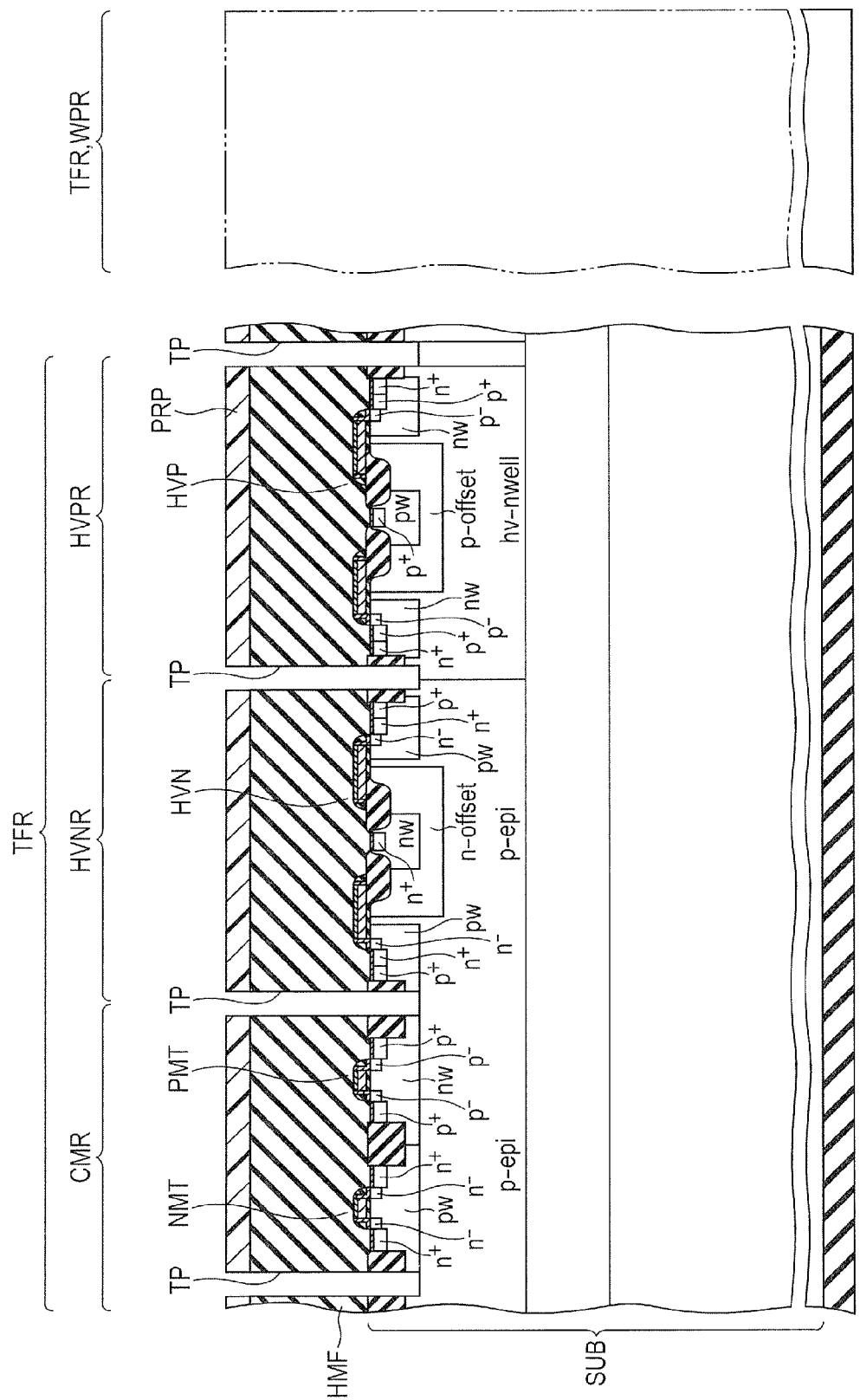
FIG. 3 is a cross sectional view showing a process performed after the process illustrated in FIG. 1 and FIG. 2, in the same embodiment.

As illustrated in FIG. 3, an etching process is performed for the silicon oxide film HMF, with using the photoresist pattern PRP as an etching mask. By so doing, there is formed an opening part TP penetrating through the silicon oxide film.

Figure 4:
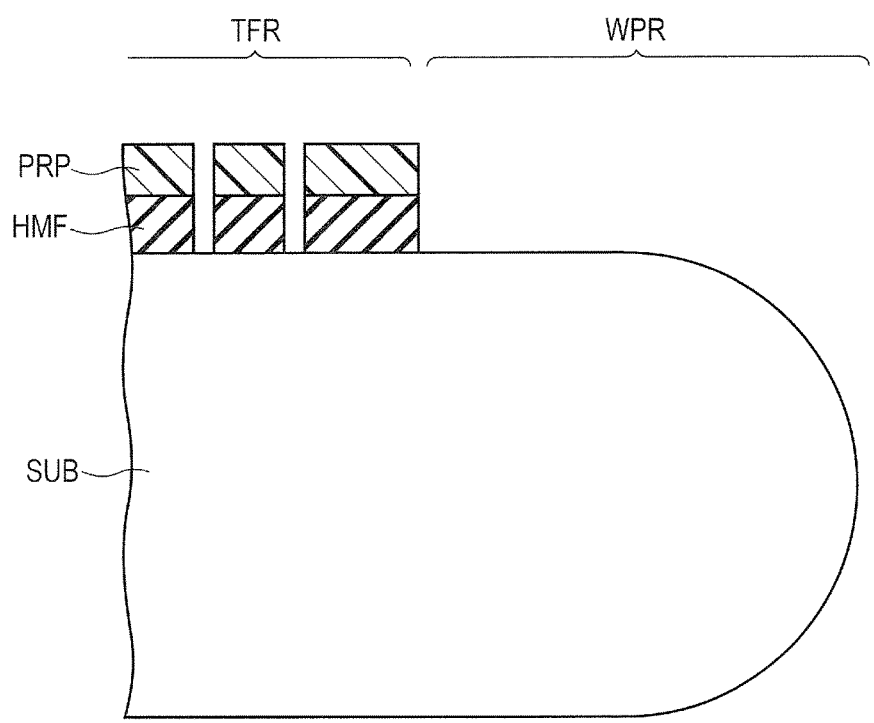
FIG. 4 is a partially enlarged cross sectional view showing a part including the outer circumferential part of the semiconductor substrate in a two-dot chain line illustrated in FIG. 3, in the process illustrated in FIG. 3, in the same embodiment.

At this time, as illustrated in FIG. 4, in the outer circumferential part WPR of the semiconductor substrate SUB, a part of the silicon oxide film HMF is removed, thereby exposing the surface of the semiconductor substrate SUB. In this case, the part of the silicon oxide film HMF is positioned in the outer circumferential region from the outer circumferential end of the semiconductor substrate SUB up to 0.5 mm to 3.0 mm. This causes to form a hard mask which is formed from the silicon oxide film HMF.

Figure 5:
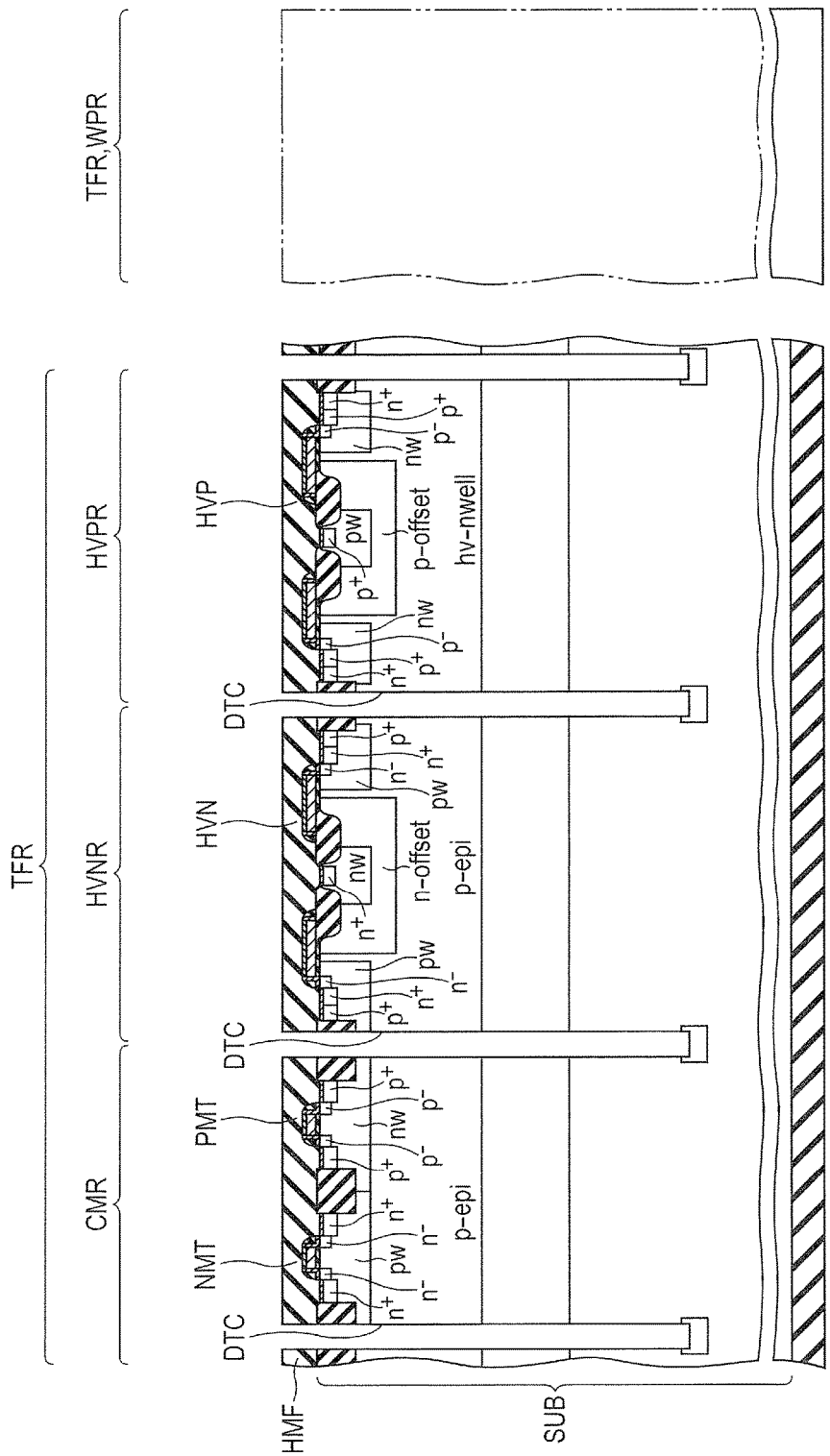
FIG. 5 is a cross sectional view showing a process performed after the process illustrated in FIG. 3 and FIG. 4, in the same embodiment.

As illustrated in FIG. 5, an etching process is performed for the semiconductor substrate SUB with using the silicon oxide film HMF as a hard mask (an etching mask), thereby forming a trench DTC which is relatively deep, approximately 1 μm to 10 μm, from the surface of the semiconductor substrate SUB.

Figure 6:
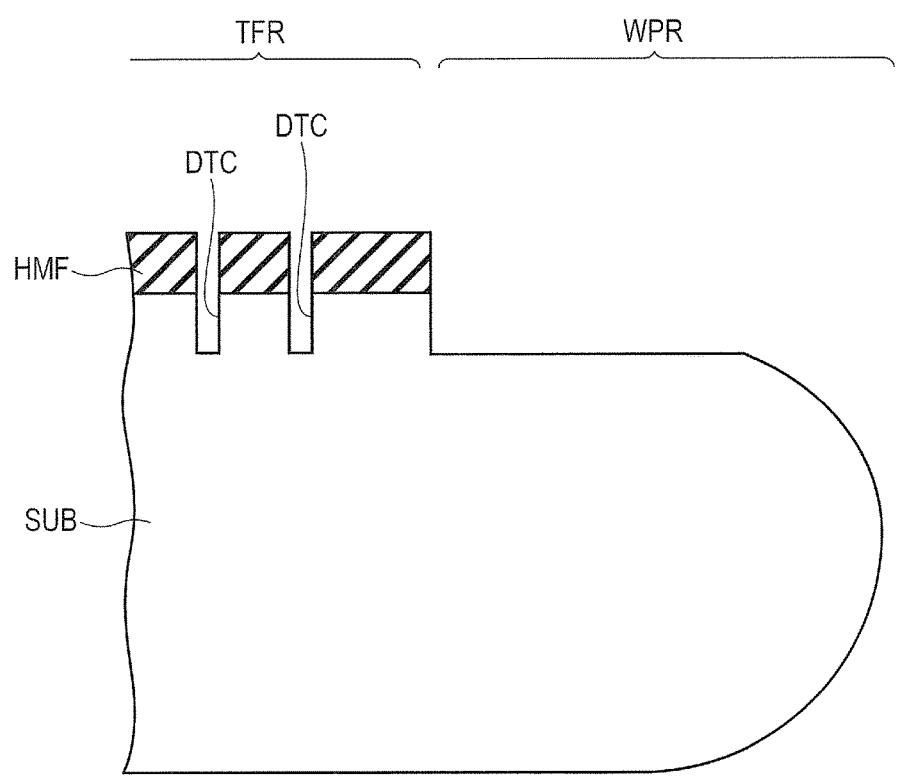
FIG. 6 is a partially enlarged cross sectional view showing a part including the outer circumferential part of the semiconductor substrate in a two-dot chain line illustrated in FIG. 5, in the process illustrated in FIG. 5, in the same embodiment.

At this time, as illustrated in FIG. 6, in the outer circumferential region in the outer circumferential part WPR of the semiconductor substrate SUB, the exposed part of the semiconductor substrate SUB is etched, and the surface of the semiconductor substrate SUB is lowered to a position lower than the surface of the semiconductor substrate of the chip formation region TFR.

Figure 7:
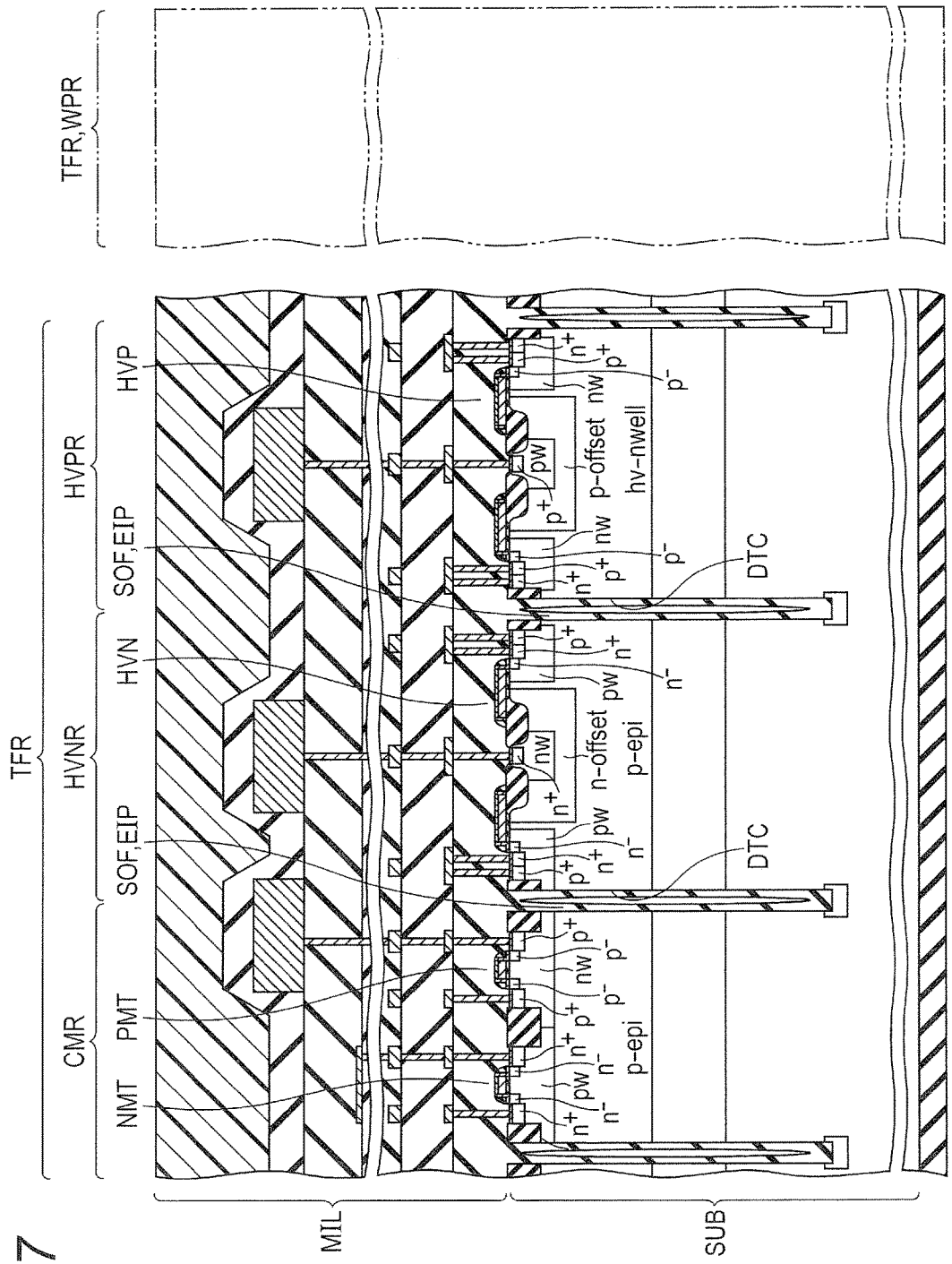
FIG. 7 is a cross sectional view showing a process performed after the process illustrated in FIG. 5 and FIG. 6, in the same embodiment.

As illustrated in FIG. 7, the trench DTC is filled with a silicon oxide film SOF, thereby forming an element isolation part EIP. After this, a multilayer wiring structure MIL including an interlayer insulating film and a wiring layer is formed over the semiconductor substrate SUB, thereby completing the main part of the semiconductor device.

In the above-described manufacturing method for a semiconductor device, when to form the relatively deep trench DTC, in the outer circumferential part WRP of the semiconductor substrate SUB, etching is performed for a part of the semiconductor substrate SUB which is positioned in the outer circumferential region from the outer circumferential end of the semiconductor substrate SUB up to 0.5 mm to 3.0 mm. As a result, when the semiconductor substrate SUB is held by the holding member, it is possible to suppress interference of the holding member with the step difference formed in the outer circumferential part WPR of the semiconductor substrate SUB.

This will specifically be described as compared with a manufacturing method for a semiconductor device, according to a comparative example. In the comparative example, the same constituent configurations as those of the semiconductor device according to the embodiment are identified by the same reference symbols, and thus will not be described over and over, unless otherwise necessary.

Figure 8:
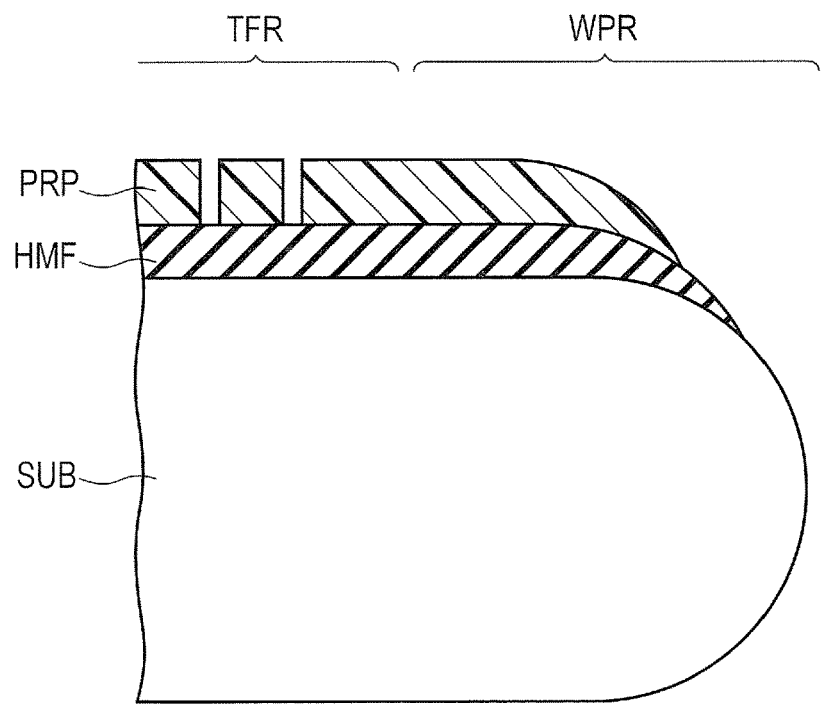
FIG. 8 is a partially enlarged cross sectional view showing a process of a manufacturing process for a semiconductor device according to a comparative example, and showing a part including the outer circumferential part of a semiconductor substrate.

First, a power semiconductor element, such as a high withstand voltage NMOS transistor, is formed in the semiconductor substrate SUB (see FIG. 1). A silicon oxide film HMF, which will serves as a hard mask, is formed to cover this power semiconductor element (see FIG. 1 and FIG. 8). At this time, as illustrated in FIG. 8, the thickness of the silicon oxide film HMF formed in the outer circumferential part WPR of the semiconductor substrate SUB is thinner than the thickness of the silicon oxide film HMF formed in the region inside the semiconductor substrate SUB, due to the manufacturing device.

Next, a photoresist is applied to the silicon oxide film HMF, and a predetermined photoengraving process is performed, thereby forming a photoresist pattern PRP for forming a trench. At this time, the photoresist is applied while rotating the semiconductor substrate SUB. Thus, in the outer circumferential part WPR of the semiconductor substrate SUB, the photoresist is blown off. Therefore, as illustrated in FIG. 8, in the outer circumferential part WPR, there exist a part in which the photoresist pattern is not formed and a part in which a very thin photoresist pattern is formed if it is formed.

Figure 9:
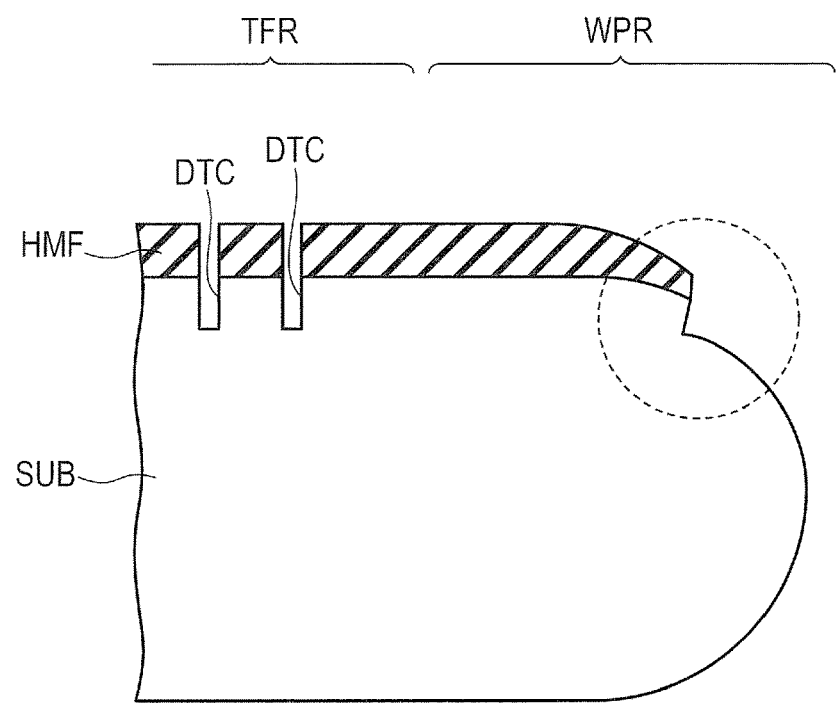
FIG. 9 is a partially enlarged cross sectional view showing a process performed after the process illustrated in FIG. 8.

As illustrated in FIG. 9, with using the photoresist pattern PRP as an etching mask, an etching process is performed for the silicon oxide film HMF, thereby forming a pattern of the silicon oxide film HMF which will serve as a hard mask. Then, an etching process is performed for the semiconductor substrate SUB with using the silicon oxide film HMF as an etching mask, thereby forming a deep trench DTC with a deepness of approximately 1 µm to 10 µm in the chip formation region TFR.

While the etching process is performed for the silicon oxide film HMF, in the outer circumferential part WPR of the semiconductor substrate SUB, a par of the silicon oxide film HMF with a relatively thin thickness is removed, thereby generating an exposed region of the semiconductor substrate SUB. The region of the semiconductor substrate SUB which is exposed to the outer circumferential part WPR is continuously etched, until the trench DTC is formed.

Figure 10:
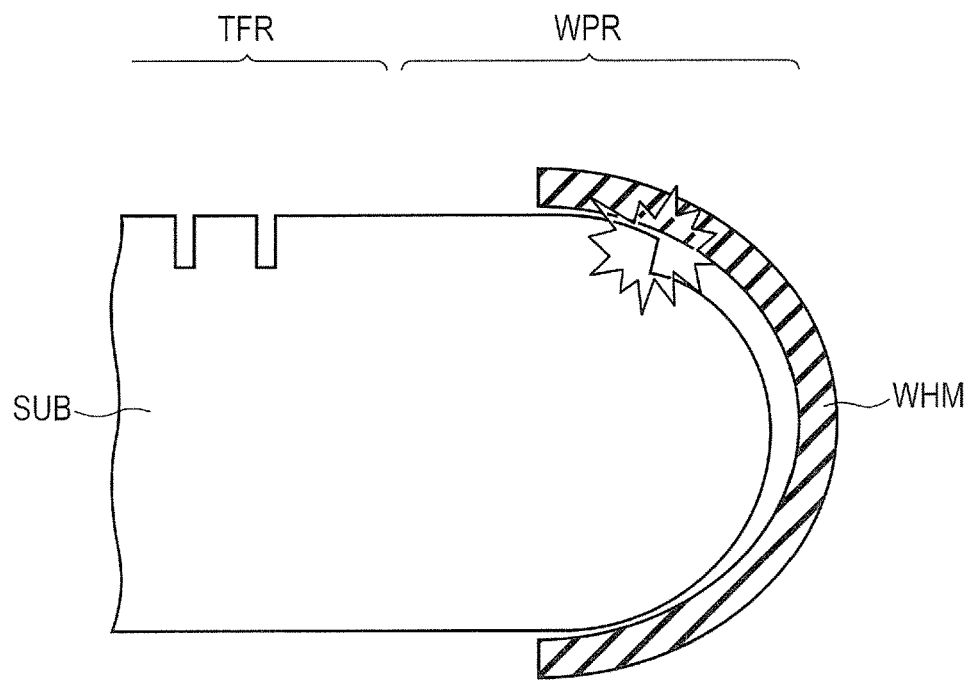
FIG. 10 is a first partially enlarged cross sectional view for explaining a problem of the manufacturing method for a semiconductor device according to the comparative example.

The semiconductor substrate SUB with the trench DTC formed therein is transported for the next process. A predetermined process is performed for the semiconductor substrate SUB by a predetermined semiconductor manufacturing device (not illustrated). When a process is performed for the semiconductor substrate SUB, or when the semiconductor substrate SUB is transported, a predetermined holding member WHM (see FIG. 10) is in contact with the outer circumferential part WPR of the semiconductor substrate SUB, thereby pinching the outer circumferential part WFP.

Figure 11:
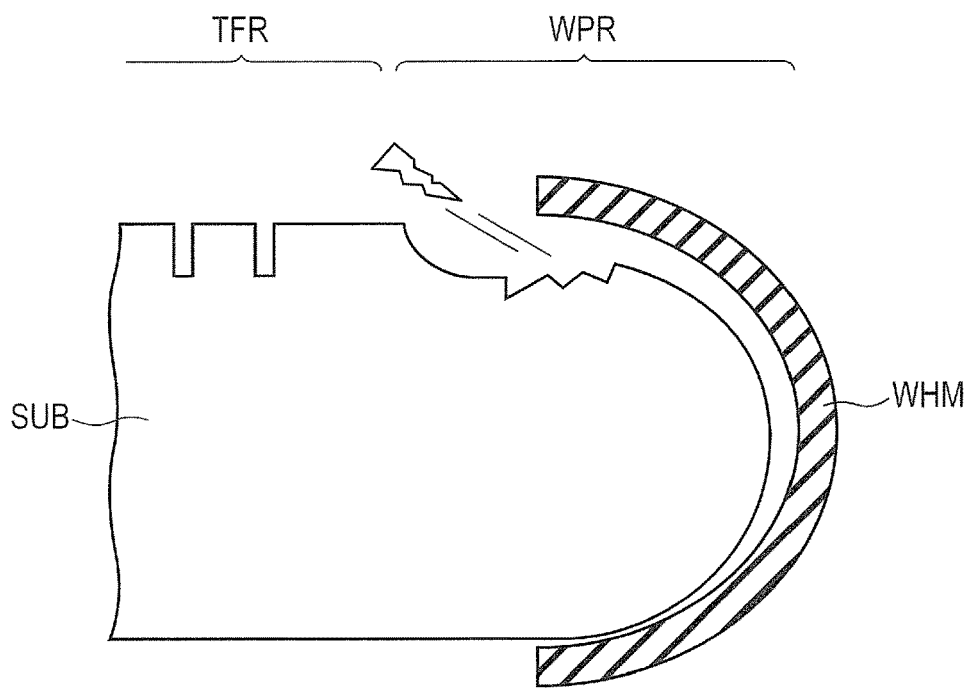
FIG. 11 is a second partially enlarged cross sectional view for explaining a problem of the manufacturing method for a semiconductor device according to the comparative example.

At this time, if a step difference exists in the outer circumferential part WPR of the semiconductor substrate SUB, the holding member WHM may interfere with this step difference. Then, as illustrated in FIG. 11, the semiconductor substrate SUB may partially be chipped (chipping). The semiconductor substrate SUB may be broken, depending on the way of interference or the degree of interference.

Descriptions will now be made to a technique, according to the comparative example, for reducing chipping or breaking of the semiconductor substrate SUB.

Figure 12:
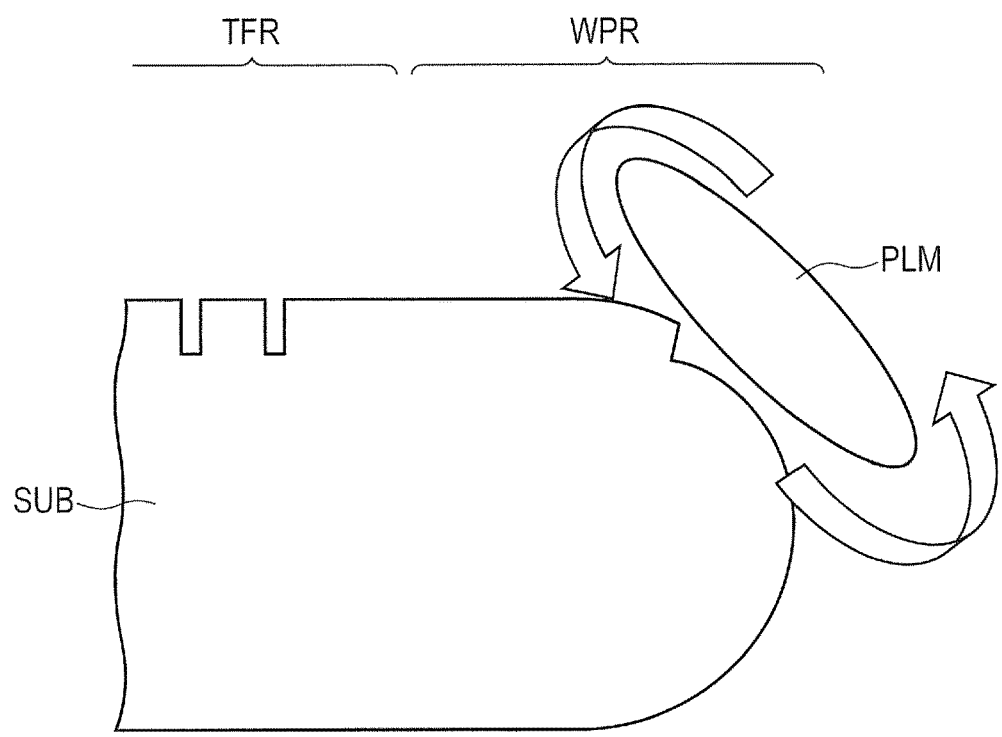
FIG. 12 is a first partially enlarged cross sectional view showing a technique for solving the problem of the manufacturing method for a semiconductor device, according to the comparative example.

As illustrated in FIG. 12, according to a first comparative example, there is a technique for reducing the level difference by performing a polishing process using a polishing member PLM, for a part with the level difference generated in the outer circumferential part WPR of the semiconductor substrate SUB. This technique additionally requires a device for performing a polishing process for the outer circumferential part WPR of the semiconductor substrate SUB, resulting in a factor of increasing the manufacturing cost.

Figure 13:
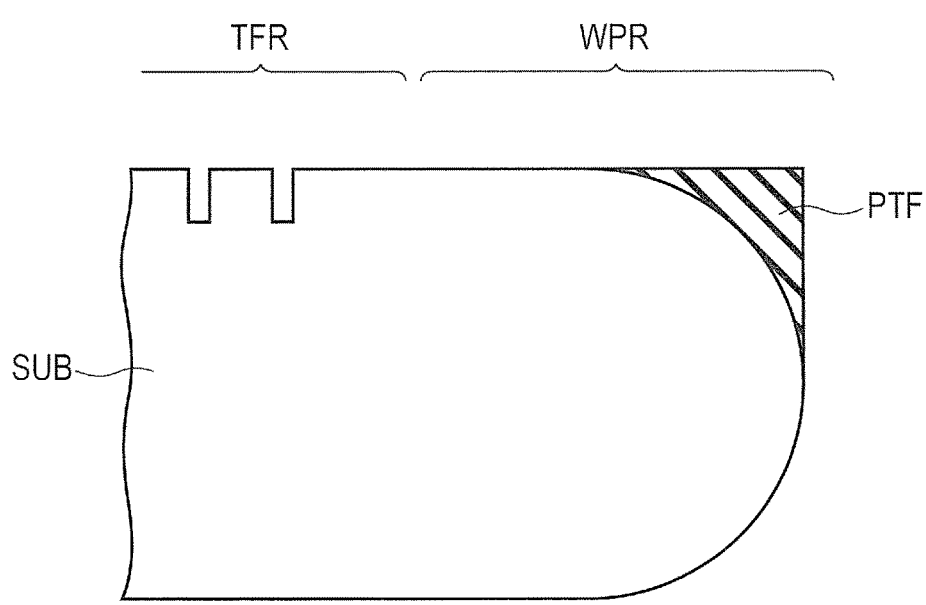
FIG. 13 is a second partially enlarged cross sectional view showing a technique for solving the problem of the manufacturing method for a semiconductor device, according to the comparative example.

As illustrated in FIG. 13, according to a second comparative example, there is a technique for avoiding etching of the outer circumferential part WPR, by additionally forming a protective film PTF covering the outer circumferential part WPR of the semiconductor substrate SUB and using an etching process at the time of forming a trench. This technique additionally requires a process for forming a protective film PTF and a process for removing this protective film PTF after the etching process, thereby resulting in a factor of increasing the manufacturing cost. This technique also causes a factor of extending the manufacturing time.

Figure 14:
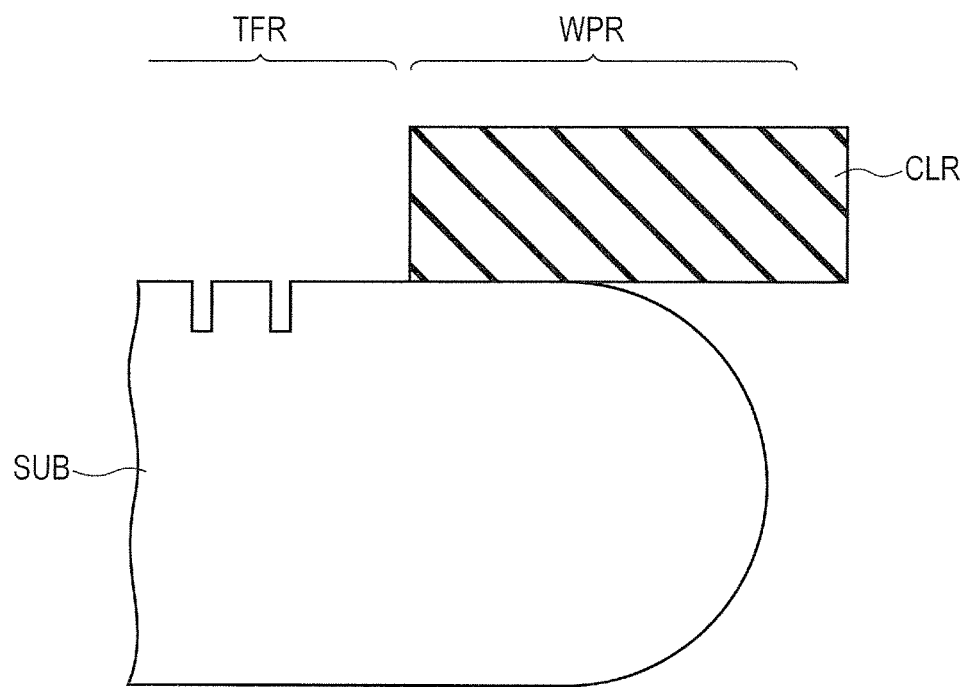
FIG. 14 is a third partially enlarged cross sectional view showing a technique for solving the problem of the manufacturing method for a semiconductor device, according to the comparative example.

As illustrated in FIG. 14, according to a third comparative example, there is a technique for attaching a clamp ring CLP to the outer circumferential part WPR, not to etch the outer circumferential part WPR due to the etching process at the time of forming the trench. This technique requires modification for attaching the clamp ring CLP to the etching device, resulting in a factor of increasing the manufacturing cost. The clamp ring CLP and the semiconductor substrate SUB interfere with each other. This may cause generation of contamination.

Unlike the manufacturing methods for a semiconductor device according to the comparative examples (the first comparative example to the third comparative example), the manufacturing method for a semiconductor device according to this embodiment, as illustrated in FIG. 2, includes a process for patterning the silicon oxide film HMF which will serve as a hard mask. In this process, in the outer circumferential part WPR, no photoresist pattern is formed in the outer circumferential region from the outer circumferential end of the semiconductor substrate SUB up to 0.5 mm to 3.0 mm. Thus, the silicon oxide film HMF is in an exposed state.

As illustrated in FIG. 4, in an etching process at the time of patterning the silicon oxide film HMF, a part of the silicon oxide film HMF which is positioned in the outer circumferential region in the outer circumferential part WPR is removed. As a result, the semiconductor substrate SUB is in an exposed state.

As illustrated in FIG. 6, in a process for etching the semiconductor substrate SUB with using the silicon oxide film HMF as an etching mask, a trench DTC is formed in the chip formation region TFR. In addition, in the outer circumferential region in the outer circumferential part WPR, the surface of the semiconductor substrate SUB is lowered.

The outer circumferential region from the outer circumferential end of the semiconductor substrate SUB up to 0.5 mm to 3.0 mm secures a region (a chip formation region) in which a semiconductor element is formed, and is defined as a region for preventing that the step difference formed in the outer circumferential part WPR is in contact with the holding member for holding the semiconductor substrate SUB.

If the distance from the outer circumferential end of the semiconductor substrate SUB is longer than 3.0 mm, the chip formation region TFR is to be restricted. On the contrary, if the distance from the outer circumferential end of the semiconductor substrate SUB is shorter than 0.5 mm, there is great likelihood that the holding member is in contact with the step difference formed in the outer circumferential part WPR.

In this manner, the surface of the semiconductor substrate SUB which is positioned in the outer circumferential region in the outer circumferential part WPR is lowered in its position. As a result, the step difference is formed in a position nearer to the chip formation region TFR in the semiconductor substrate SUB (see in the dotted frame of FIG. 6).

Figure 15:
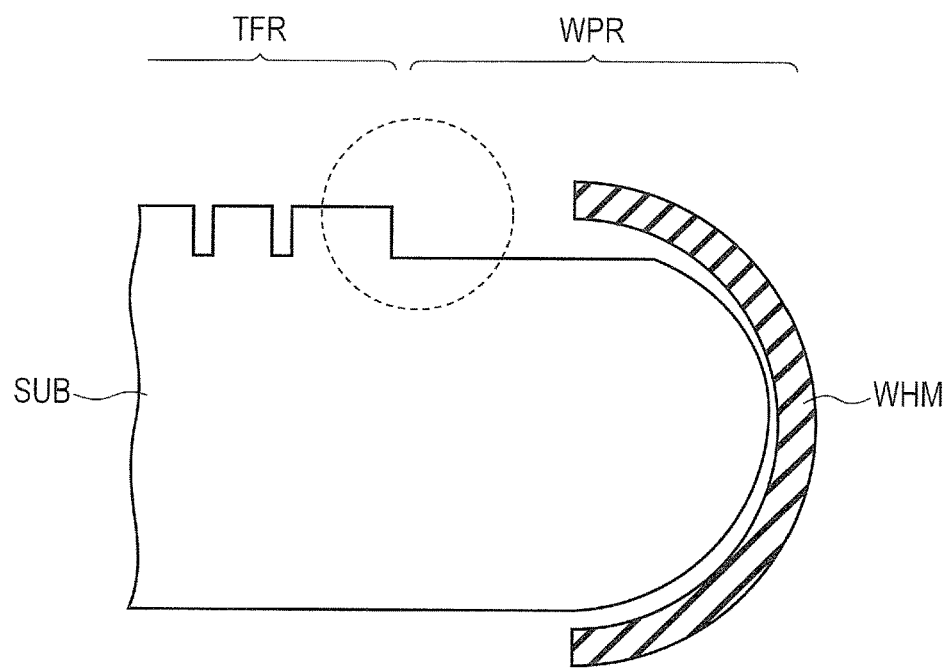
FIG. 15 is a partially enlarged cross sectional view showing a part including the outer circumferential part of the semiconductor substrate, for explaining a functional effect of the manufacturing method for a semiconductor device, in the same embodiment.

Accordingly, as illustrated in FIG. 15, the holding member WHM is not to be in contact with the step difference formed in the outer circumferential part WPR of the semiconductor substrate SUB. As a result, in the following process, it is possible to reduce chipping of a part of the semiconductor substrate SUB. It is also possible to reduce breaking of the semiconductor substrate SUB.

In the above-described semiconductor device, the descriptions have been made to the semiconductor device having the DTI structure having the power semiconductor element mounted therein. The above-descried manufacturing method is applicable not only to the semiconductor device having the power semiconductor element mounted therein, but also to the semiconductor device having a trench which is relatively deep, approximately 1 µm or greater.

The semiconductor device may be sold (wafer selling) in a state where the semiconductor substrate (wafer) is not diced. In this case, the outer circumferential part WPR of the semiconductor substrate SUB remains. In the outer circumferential part WPR, the surface of the semiconductor substrate SUB which is positioned in the outer circumferential region from the outer circumferential end of the semiconductor substrate SUB up to 0.5 mm to 3.0 mm is in a position lower than the surface of the semiconductor substrate SUB which is positioned in the chip formation region TFR.

The manufacturing methods described based on the embodiments may be combined variously as needed.

Accordingly, the descriptions have specifically been made to the inventions made by the present inventors based on the embodiments. However, the present invention is not limited to the above-described embodiments. Various changes may possibly be made without departing from the scope thereof.

What is claimed is:

1. A manufacturing method for a semiconductor device, comprising:
    defining an element formation region on a surface of a semiconductor substrate;
    forming a semiconductor element in the element formation region, the semiconductor element including a transistor;
    forming a first insulating film to cover the semiconductor element;
    forming a mask by performing a first etching process on the first insulating film, the mask having an opening part corresponding to a pattern of an element isolation part for electrically isolating the semiconductor element;
    forming an isolation trench by performing a second etching process using the mask as a first etching mask, the isolation trench extending from the surface of the semiconductor substrate to a first depth; and
    forming the element isolation part by forming a second insulating film in the isolation trench,
    wherein the forming the mask is such that the mask is formed in the element formation region but not in an outer circumferential region, which extends inwardly a first distance from an outer circumferential edge of the semiconductor substrate, and
    wherein, in the second etching process to form the isolation trench, a part of the semiconductor substrate in the outer circumferential region is also etched.

2. The manufacturing method for a semiconductor device, according to claim 1,
    wherein the first distance is in a range from 0.5 mm to 3.0 mm.

3. The manufacturing method for a semiconductor device, according to claim 1,
    wherein the first depth is at least 1 µm.

4. The manufacturing method for a semiconductor device, according to claim 1,
    wherein the forming the semiconductor element includes forming a power semiconductor element.

5. The manufacturing method for a semiconductor device, according to claim 4,
    wherein the forming the power semiconductor element includes forming a high withstand voltage MOS transistor.

6. A manufacturing method for a semiconductor device, comprising:
    defining an element formation region on a surface of a semiconductor substrate;
    forming a semiconductor element in the element formation region;
    forming a first insulating film to cover the semiconductor element;
    forming a mask having an opening part corresponding to a pattern of an element isolation part for electrically isolating the semiconductor element, by performing a first etching process for the first insulating film;
    forming an isolation trench extending from the surface of the semiconductor substrate to a first depth, by performing a second etching process using the mask as a first etching mask; and
    forming the element isolation part by forming a second insulating film in the isolation trench,
    wherein the mask is formed in a state excluding an outer circumferential region, which extends inwardly a first distance from an outer circumferential edge of the semiconductor substrate,
    wherein the second etching process is performed for a part of the semiconductor substrate, which is positioned in the outer circumferential region, in the forming the isolation trench, and
    wherein the forming the mask includes:
        removing a part of a photoresist positioned in the outer circumferential region by performing peripheral exposure for the photoresist for patterning the first insulating film, and performing the first etching process for the first insulating film using the photoresist as a second etching mask.

7. The manufacturing method according to claim 1, wherein, in the forming the mask, the first etching process exposes an upper surface of the semiconductor substrate in the outer circumferential region.

8. The manufacturing method according to claim 7, wherein, in the forming the isolation trench, the second etching process etches the exposed upper surface of the semiconductor substrate in the outer circumferential region.

9. The manufacturing method according to claim 8, wherein, after the second etching process, the etched upper surface of the semiconductor substrate in the outer circumferential region is at a same height as a bottom surface of the isolation trench.

10. The manufacturing method according to claim 1, wherein, prior to the first etching process, the first insulating film is in contact with an upper surface of the semiconductor substrate in both the element formation and the outer circumferential region.

11. The manufacturing method according to claim 10, wherein, after the first etching process, the mask formed of the etched first insulating film is in the element formation region but not the outer circumferential region.

12. A semiconductor device comprising:
an element formation region which is defined on a semiconductor substrate;
a semiconductor element which is formed in the element formation region, the semiconductor element including a transistor;
an element isolation part comprising an isolation trench that extends from a surface of the semiconductor substrate to a first depth, the element isolation part electrically isolating the semiconductor element; and
an interlayer insulating film which is formed to cover the semiconductor element,
wherein an upper surface of a first part of the semiconductor substrate that is positioned in an outer circumferential region, which extends inwardly a first distance from an outer circumferential edge of the semiconductor substrate, is lower than an upper surface of a second part of the semiconductor substrate that is positioned in the element formation region, and
wherein a portion of the interlayer insulating film is disposed in the isolation trench to form the element isolation part.

13. The semiconductor device according to claim 12, wherein the first distance is in a range from 0.5 mm to 3.0 mm.

14. The semiconductor device according to claim 12, wherein the first depth is at least 1 μm.

15. The semiconductor device according to claim 12, wherein the semiconductor element includes a power semiconductor element.

16. The semiconductor device according to claim 12, wherein the power semiconductor element includes a high withstand voltage MOS transistor.

17. The semiconductor device according to claim 12, wherein an upper surface of the first part of the semiconductor substrate in the outer circumferential region is at a same height as a bottom surface of the isolation trench.

* * * * *